(12) United States Patent
Ishino et al.

(10) Patent No.: US 10,535,577 B2
(45) Date of Patent: Jan. 14, 2020

(54) SEMICONDUCTOR DEVICE

(71) Applicant: DENSO CORPORATION, Kariya, Aichi-pref. (JP)

(72) Inventors: Hiroshi Ishino, Kariya (JP); Hideki Kawahara, Kariya (JP); Shinji Hiramitsu, Kariya (JP); Shunsuke Arai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/088,093

(22) PCT Filed: Apr. 27, 2017

(86) PCT No.: PCT/JP2017/016674
§ 371 (c)(1),
(2) Date: Sep. 25, 2018

(87) PCT Pub. No.: WO2017/199723
PCT Pub. Date: Nov. 23, 2017

(65) Prior Publication Data
US 2019/0088568 A1    Mar. 21, 2019

(30) Foreign Application Priority Data

May 20, 2016 (JP) ................................. 2016-101245

(51) Int. Cl.
*H01L 23/36*  (2006.01)
*H01L 25/07*  (2006.01)
(Continued)

(52) U.S. Cl.
CPC .............. *H01L 23/36* (2013.01); *H01L 24/42* (2013.01); *H01L 25/07* (2013.01); *H02M 7/48* (2013.01);
(Continued)

(58) Field of Classification Search
CPC .......... H01L 23/36; H01L 23/40; H01L 23/42
See application file for complete search history.

(56) References Cited

U.S. PATENT DOCUMENTS

| 2002/0024134 A1 | 2/2002 | Arai et al. |
| 2005/0194660 A1 | 9/2005 | Mochizuki et al. |

(Continued)

FOREIGN PATENT DOCUMENTS

| JP | 5378293 B2 | 12/2013 |
| JP | 2014-183638 A | 9/2014 |

(Continued)

*Primary Examiner* — Quoc D Hoang
(74) *Attorney, Agent, or Firm* — Posz Law Group, PLC

(57) ABSTRACT

In a semiconductor device, a plurality of semiconductor chips included in an upper-arm circuit are connected in parallel between a pair of upper-arm plates, while a plurality of semiconductor chips included in a lower-arm circuit are connected in parallel between a pair of lower-arm plates. In each of the arm circuits, the plurality of semiconductor chips are arranged in a direction perpendicular to a direction in which emitter electrodes and pads are arranged, the pads are disposed on the same side of the emitter electrodes, and signal terminals extend in the same direction. A series-connecting part between the upper- and lower-arm circuits includes a joint part 20 continued to respective side surfaces of the corresponding upper- and lower-arm plates. Each of inductances of respective parallel-connecting parts of the upper- and lower-arm plates which connect the semiconductor chips in parallel is smaller than an inductance of the series-connecting part.

9 Claims, 9 Drawing Sheets

(51) Int. Cl.
*H02M 7/48* (2007.01)
*H01L 23/00* (2006.01)

(52) U.S. Cl.
CPC ............... *H01L 2224/33* (2013.01); *H01L 2224/48247* (2013.01); *H01L 2224/49175* (2013.01); *H01L 2924/181* (2013.01)

(56) References Cited

U.S. PATENT DOCUMENTS

| | | |
|---|---|---|
| 2011/0299265 A1 | 12/2011 | Nakatsu et al. |
| 2014/0110752 A1 | 4/2014 | Fujuno et al. |
| 2014/0160822 A1* | 6/2014 | Kuwano ............... H02M 7/003 363/141 |
| 2016/0149512 A1 | 5/2016 | Nakatsu et al. |
| 2016/0308456 A1 | 10/2016 | Nakatsu et al. |
| 2017/0302191 A1 | 10/2017 | Nakatsu et al. |

FOREIGN PATENT DOCUMENTS

| | | |
|---|---|---|
| JP | 2015-211087 A | 11/2015 |
| JP | 2016-004941 A | 1/2016 |
| JP | 5879238 B2 | 3/2016 |
| WO | 2015/025582 A1 | 2/2015 |

* cited by examiner

SEMICONDUCTOR DEVICE

CROSS REFERENCE TO RELATED APPLICATIONS APPLICATION

This application is a U.S. national phase of International Application No. PCT/JP2017/016674 filed on Apr. 27, 2017 and is based on Japanese Patent Application No. 2016-101245 filed on May 20, 2016, the disclosures of which are incorporated herein by reference.

TECHNICAL FIELD

The present disclosure relates to a semiconductor device having a double-surface heat dissipation structure.

BACKGROUND ART

As disclosed in Patent Literature 1, a semiconductor device having a double-surface heat dissipation structure is known in which an upper-arm chip included in an upper-arm circuit is disposed between a pair of upper-arm plates, a lower-arm chip included in a lower arm is disposed between a pair of lower-arm plates, and the upper-arm circuit and a lower-arm circuit are connected via a joint part. In this semiconductor device, the one upper-arm chip is disposed between the upper-arm plates, while the one lower-arm chip is disposed between the lower-arm plates.

PRIOR ART LITERATURE

Patent Literature

Patent Literature 1: JP 2016-4941 A

SUMMARY OF INVENTION

When used for power control, a semiconductor device having a double-surface heat dissipation structure is required to produce a large output (current capacity), and a configuration in which, e.g., semiconductor chips are connected in parallel may be adopted. However, when a parallel connection structure is adopted, current variation or abnormal gate oscillation is likely to occur.

The current variation can be suppressed by providing a symmetrical circuit layout. For example, when two upper-arm chips are connected in parallel between a pair of upper-arm plates, it can be considered to use a configuration in which the upper-arm chips are arranged in a direction perpendicular to the extending direction of a joint part and signal terminals are extended in opposite directions each corresponding to the direction in which the upper-arm chips are arranged. However, since the signal terminals in the same arm are extended in the opposite directions, a connection structure between the signal terminals and the outside (external device) is complicated.

In addition, by inserting a ferrite bead or a gate resistance in series in a gate, the abnormal oscillation thereof can be suppressed. However, such countermeasures undesirably increase a switching loss.

An object of the present disclosure is to provide a semiconductor device which allows current variation and abnormal gate oscillation to be suppressed, while allowing a connection structure between signal terminals and the outside to be simplified.

According to an aspect of the present disclosure, a semiconductor device includes:

a pair of upper-arm plates and a pair of lower-arm plates, each serving as a pair of heat dissipation plates;

a plurality of upper-arm chips and a plurality of lower-arm chips which is the same in number as the upper-arm chips, each of the upper- and lower-arm chips being a semiconductor chip in which a switching element is formed and which has main electrodes respectively formed on a one surface and a back surface opposite to the one surface in a thickness direction and has a signal pad formed at a position on the back surface different from a position of the main electrode on the back surface, the main electrode on the one surface being electrically connected to one of the pair of heat dissipation plates, the main electrode on the back surface being electrically connected to the other of the pair of heat dissipation plate, the upper-arm chips being arranged in a first direction perpendicular to the thickness direction and connected in parallel to each other between the pair of upper-arm plates to form an upper-arm circuit in conjunction with the pair of upper-arm plates, the lower-arm chips being arranged in a second direction perpendicular to the thickness direction and connected in parallel to each other between the pair of lower-arm plates to form a lower-arm circuit in conjunction with the pair of lower-arm plates;

a plurality of signal terminals correspondingly and electrically connected to the pads of the semiconductor chips;

a joint part electrically connecting one of the pair of upper-arm plates which is disposed on a lower-potential side of each of the upper-arm chips and one of the pair of lower-arm plates which is disposed on a higher-potential side of each of the lower-arm chips; and a sealing resin body integrally sealing at least a portion of each of the pair of upper-arm plates, at least a portion of each of the pair of lower-arm plates, the semiconductor chips, the joint part, and a portion of each of the signal terminals, in which the pads of the upper-arm chips are formed on the same side of the main electrodes on the back surfaces in a direction perpendicular to both of the first direction and the thickness direction, and the signal terminals corresponding to the upper-arm chips extend in the same direction, the pads of the lower-arm chips are formed on the same side of the main electrodes on the back surfaces in a direction perpendicular to both of the second direction and the thickness direction, and the signal terminals corresponding to the lower-arm chips extend in the same direction, the joint part is continued to one end portion of the upper-arm plate in the first direction which is closer to the lower-arm plate and also continued to one end portion of the lower-arm plate in the second direction which is closer to the upper-arm plate, and each of inductances of parallel-connecting parts of the pair of upper-arm plates which connect the plurality of upper-arm chips in parallel and inductances of parallel-connecting parts of the pair of lower-arm plates which connect the plurality of lower-arm chips in parallel is smaller than an inductance of a series-connecting part which includes the joint part and connects the upper-arm circuit and the lower-arm circuit in series.

In accordance with the aspect, in the plurality of semiconductor chips connected in parallel, the pads are formed on the same side of the main electrode, and the corresponding signal terminals extend in the same direction. This allows a connection structure between the signal terminals and the outside to be simplified.

In addition, each of the inductances of the parallel-connecting parts is smaller than the inductance of the series-connecting part including the joint part. For example, when it is assumed that the inductance of the series-connecting part has a predetermined value, the inductance of each of the parallel-connecting parts can be reduced compared to that in a configuration in which the inductance of the parallel-connecting part is set to be equal to or larger than the inductance of the series-connecting part. This can suppress current variation, while allowing the layout of the pads described above to be used. By satisfying the magnitude relationship between the inductances described above, it is possible to suppress abnormal gate oscillation. Since a gate resistance or the like need not be inserted in a gate, it is possible to suppress abnormal gate oscillation, while suppressing an increase in switching loss. The effect of suppressing abnormal oscillation has been recognized by experiment.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
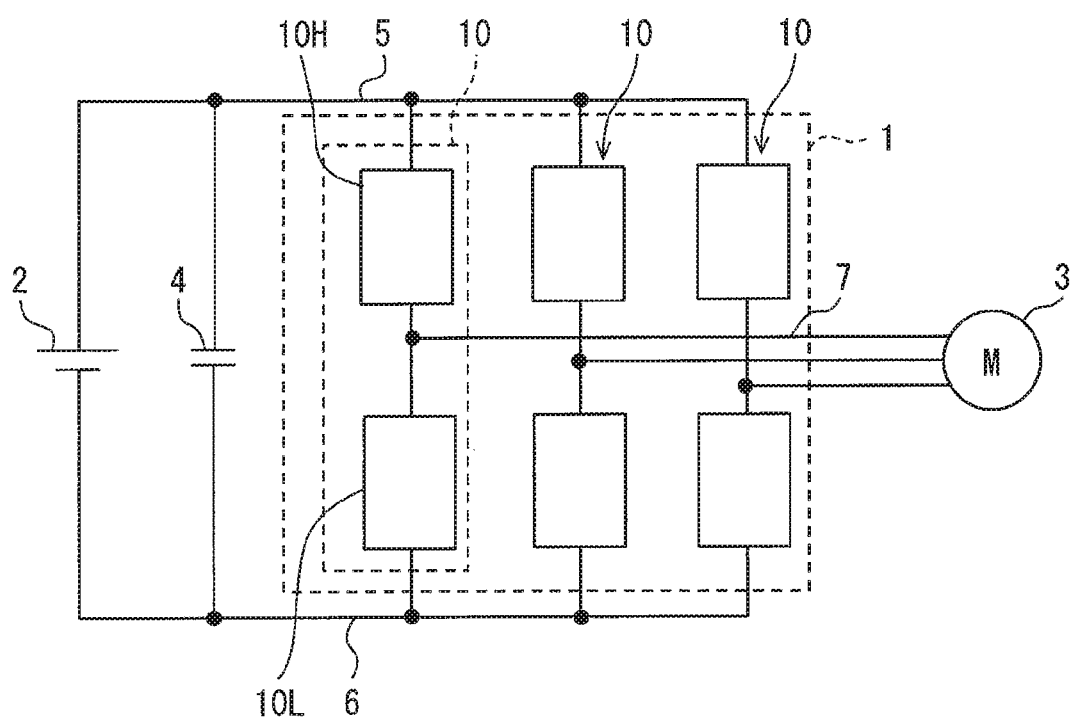
FIG. 1 is a view showing a schematic configuration of a power conversion device to which a semiconductor device according to a first embodiment is applied.

Referring to the drawings, a plurality of embodiments will be described. In the plurality of embodiments, functionally and/or structurally corresponding parts are given the same reference numerals. In the following description, a thickness direction of each of semiconductor chips is shown as a Z-direction, and a direction which is perpendicular to the Z-direction and in which semiconductor chips of an upper arm are arranged is shown as a Y-direction. A direction perpendicular to both of the Z-direction and the Y-direction is shown as an X-direction. Also, a shape along an XY-plane defined by the X-direction and the Y-direction each described above is referred to as a two-dimensional shape, unless particularly described otherwise. The Z direction corresponds to the thickness direction, and the X direction corresponds to a first direction.

First Embodiment

First, on the basis of FIG. 1, a description will be given of an example of a power conversion device to which a semiconductor device is applied.

A power conversion device 1 shown in FIG. 1 is configured so as to convert a DC voltage supplied from a DC power source 2 (battery) to a three-phase AC current and output the three-phase AC current to a three-phase AC motor 3. The power conversion device 1 thus configured is mounted in, e.g., an electric vehicle or a hybrid vehicle. Note that the power conversion device 1 can also convert the power generated by the motor 3 to a DC power and charge the DC power source 2 with the DC power. The reference numeral 4 shown in FIG. 1 denotes a smoothing capacitor.

The power conversion device 1 has a three-phase inverter. The three-phase inverter has upper and lower arms for three phases, which are provide between a higher-potential power source line 5 connected to the positive (higher-potential) electrode of the DC power source 2 and a lower-potential power source line 6 connected to the negative (lower-potential) electrode of the DC power source 2. The upper and lower arms in each of the phases are formed of one of semiconductor devices 10. That is, each of the semiconductor devices 10 forms the upper and lower arms corresponding to one of the phases. The upper and lower arms include an upper arm 10H and a lower arm 10L which are connected in series. The respective output terminals of the upper and lower arms are connected to an output line 7 of the motor 3. The upper arm 10H corresponds to an upper-arm circuit, while the lower arm 10L corresponds to a lower-arm circuit.

Note that the power conversion device 1 may also include, in addition to the three-phase inverter described above, a boosting converter which boosts the DC voltage supplied from the DC power source 2, a gate drive circuit which controls the operation of each of the switching elements forming the three-phase inverter and the boosting converter, and the like.

Next, on the basis of FIGS. 2 to 4, a description will be given of the semiconductor device 10.

Figure 2:
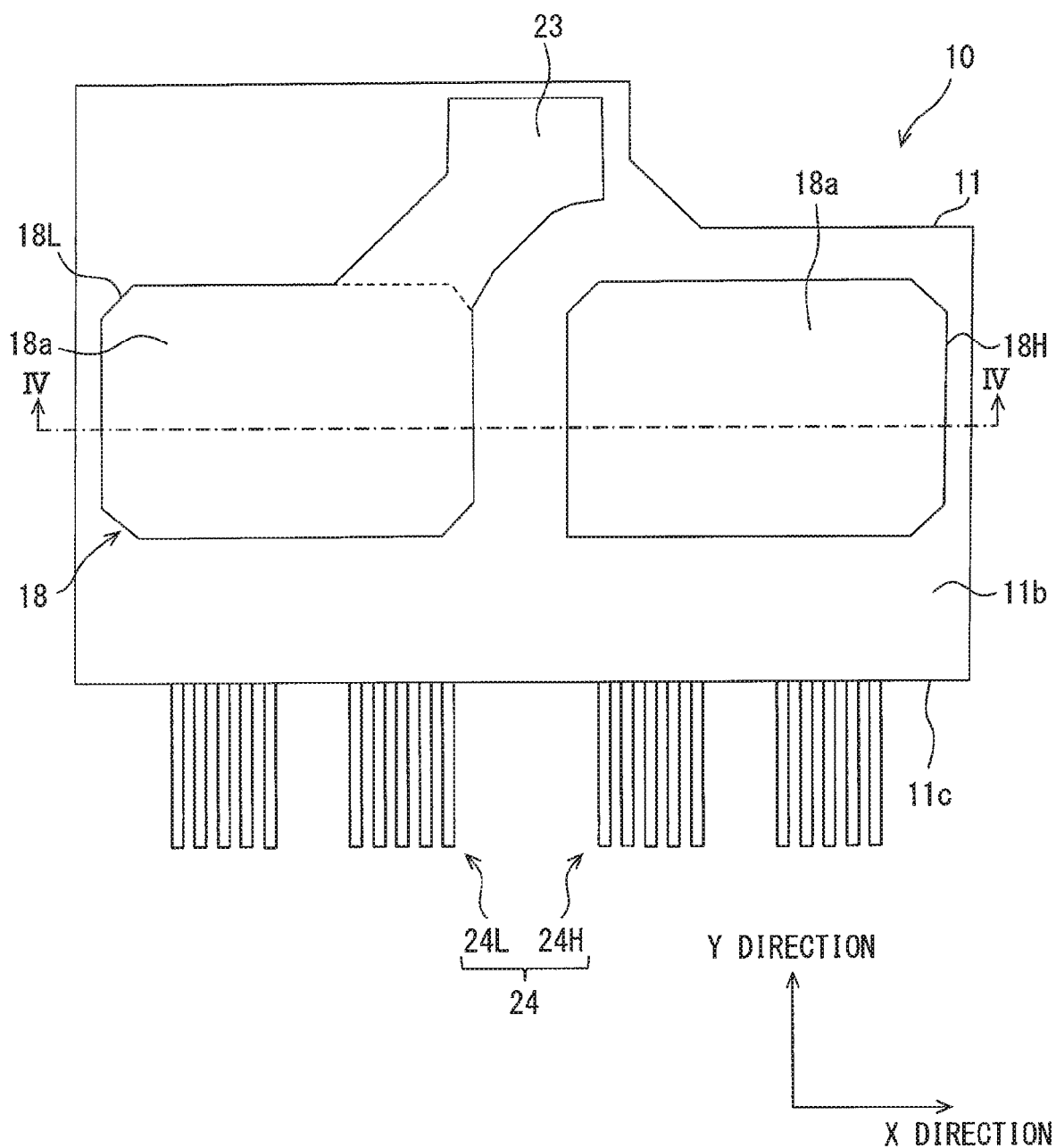
FIG. 2 is a plan view showing a schematic configuration of the semiconductor device according to the first embodiment.
Figure 3:
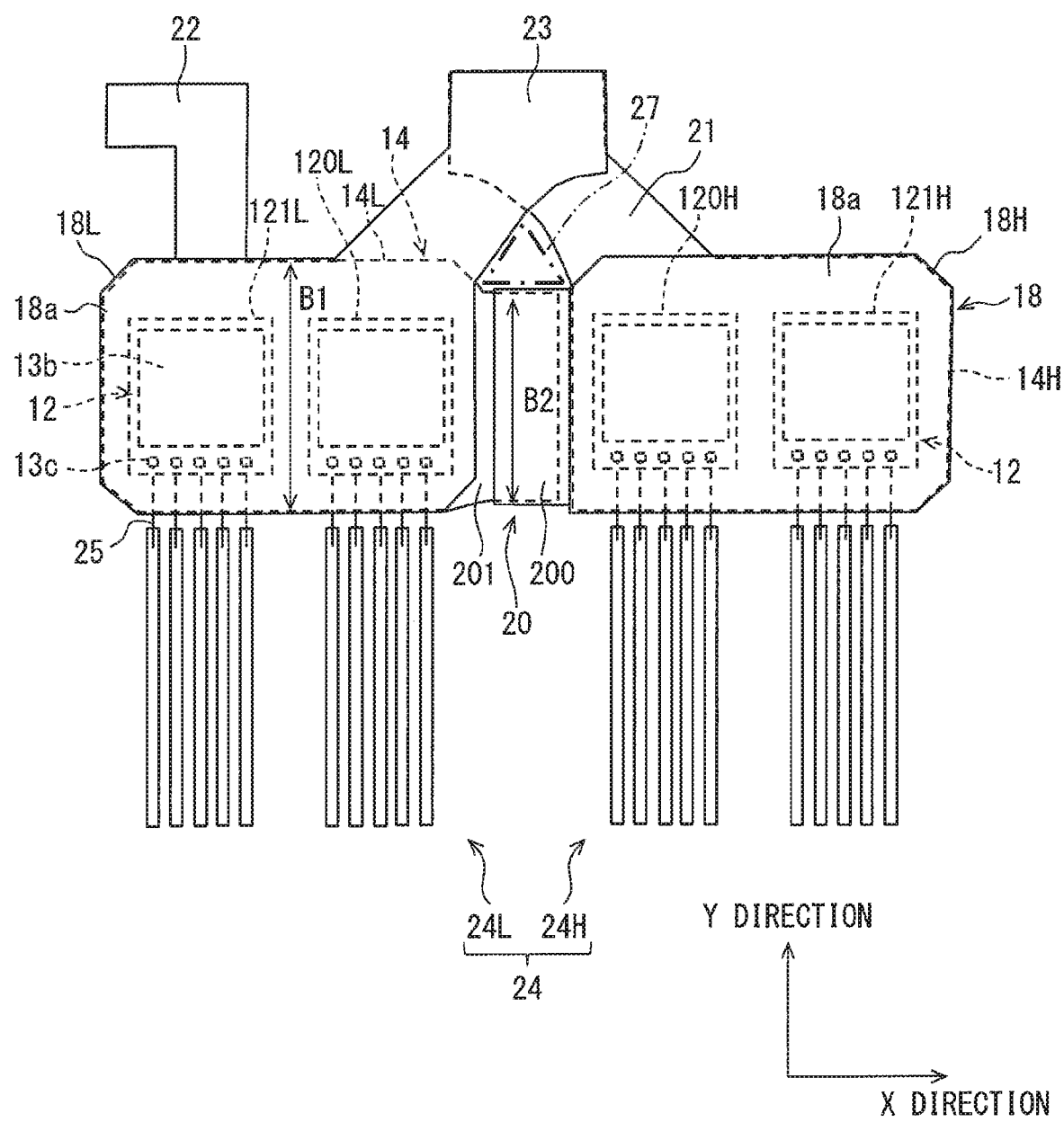
FIG. 3 is a view of the semiconductor device shown in FIG. 2 from which a sealing resin body is omitted.
Figure 4:
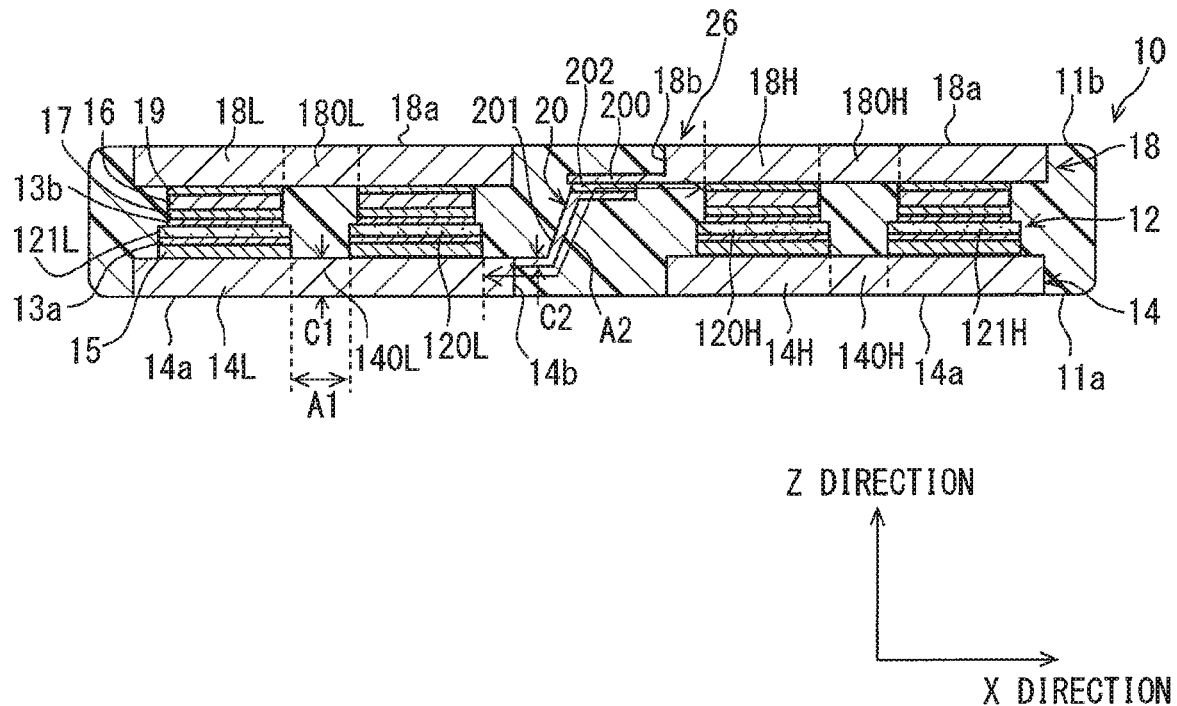
FIG. 4 is a cross-sectional view along the line IV-IV in FIG. 2.

As shown in FIGS. 2 to 4, the semiconductor device 10 includes a sealing resin body 11, semiconductor chips 12, heat sinks 14, terminals 16, heat sinks 18, a joint part 20, main terminals 21, 22, and 23, and signal terminals 24. In the following description, H at the end of each of reference numerals shows that the element denoted thereby is an element included in the upper arm 10H, while L at the end of each of reference numerals shows that the element denoted thereby is an element included in the lower arm 10L. Some of elements are denoted by reference numerals having additional H's or L's at the ends thereof to clearly show that the elements are the elements included in the upper arm 10H or the lower arm 10L, while others of the elements are denoted by common reference numerals denoting both the elements included in the upper arm 10H and the elements included in the lower arm 10L.

The sealing resin body 11 is made of, e.g., an epoxy-based resin. The sealing resin body 11 is formed by, e.g., a transfer mold method. The sealing resin body 11 has a one surface 11a perpendicular to the Z-direction, a back surface 11b opposite to the one surface 11a, and side surfaces connecting the one surface 11a and the back surface 11b. The one surface 11a and the back surface 11b are, e.g., planar surfaces. The sealing resin body 11 has a side surface 11c from which the signal terminals 24 protrude.

Each of the semiconductor chips 12 includes a semiconductor substrate made of silicon, silicon carbide, or the like and a power transistor, such as an insulated-gate bipolar transistor (IGBT) or a MOSFET, formed as a switching element in the semiconductor substrate. In the present embodiment, an n-channel IGBT and a back-flow diode (FWD) connected in anti-parallel to the IGBT are formed. That is, in the semiconductor chip 12, an RC (Reverse Conducting)-IGBT is formed. The semiconductor chip 12 has a generally rectangular two-dimensional shape.

The IGBT and the FWD have a vertical structure to allow a current to flow in the Z-direction. In the thickness direction of each of the semiconductor chips 12, i.e., in the Z-direction, a collector electrode 13a is formed on one surface of the semiconductor chip 12, while an emitter electrode 13b is formed on the back surface thereof opposite to the one surface. The collector electrode 13a serves also as the cathode electrode of the FWD, while the emitter electrode 13b serves also as the anode electrode of the FWD. The collector electrode 13a and the emitter electrode 13b correspond to main electrodes.

The semiconductor chips 12 include semiconductor chips 120H and 121H included in the upper arm 10H and semiconductor chips 120L and 121L included in the lower arm 10L. The semiconductor chips 120H and 121H correspond to upper-arm chips, while the semiconductor chips 120L and 121L correspond to lower-arm chips. The semiconductor chips 120H, 120L, 121H, and 121L have substantially the same two-dimensional shapes, specifically, generally rectangular two-dimensional shapes, substantially the same sizes, and substantially the same thicknesses. The semiconductor chips 120H, 120L, 121H, and 121L have substantially the same configurations. The semiconductor chips 120H and 121H included in the upper arm 10H are disposed such that the respective collector electrodes 13a thereof are on the same side of the semiconductor chips 120H and 121H in the Z-direction, and the respective emitter electrodes 13b thereof are on the same side of the semiconductor chips 120H and 121H in the Z-direction. The semiconductor chips 120H and 121H are disposed at substantially the same heights in the Z-direction, while being arranged side by side in the X-direction.

The semiconductor chips 120L and 121L included in the lower arm 10L are disposed such that the respective collector electrodes 13a thereof are on the same side of the semiconductor chips 120L and 121L in the Z-direction, and the respective emitter electrodes 13b thereof are on the same side of the semiconductor chips 120L and 121L in the Z-direction. The semiconductor chips 120L and 121L are also disposed at substantially the same heights in the Z-direction, while being arranged side by side in the X-direction. The direction in which the semiconductor chips 120L and 121L are arranged corresponds to a second direction. In the present embodiment, the second direction coincides with the X-direction, similarly to the first direction. Also, the semiconductor chips 120H, 120L, 121H, and 121L are aligned in a row along the X-direction.

On the back surfaces of the semiconductor chips 12, i.e., on the surfaces thereof where the emitter electrodes are formed, pads 13c as signal electrodes are also formed. The pads 13c are formed at positions other than those of the emitter electrodes 13b. The pads 13c are electrically isolated from the emitter electrodes 13b. In the Y-direction, the pads 13c are formed at end portions opposite to the regions where the emitter electrodes 13b are formed.

In the present embodiment, each of the semiconductor chips 12 has the five pads 13c. Specifically, each of the semiconductor chips 12 has, as the five pads 13c, the pad for a gate electrode, the pad for a Kelvin emitter which detects the potential of the emitter electrode 13b, the pad for sensing a current, the pad for the anode potential of a temperature sensor (temperature sensing diode) which detects the temperature of the semiconductor chip 12, and the pad for a cathode potential. The five pads 13c are collectively formed closer to one end of the semiconductor chip 12 having a generally rectangular two-dimensional shape in the Y-direction, while being arranged in the X-direction.

The semiconductor chips 12 are disposed to be arranged in a direction perpendicular to both of the direction in which the emitter electrodes 13b and the pads 13c are arranged and the Z-direction as the thickness direction. In the present embodiment, in each of the semiconductor chips 12, the emitter electrode 13b and the pads 13c are arranged in the Y-direction. Accordingly, all the semiconductor chips 12 are disposed to be arranged in the X-direction.

Each of the heat sinks 14 has the function of dissipating heat from the corresponding semiconductor chip 12 to the outside of the semiconductor device 10 and also has the function of a wire. Accordingly, to ensure a thermal conductivity and an electrical conductivity, the heat sink 14 is formed using at least a metal material. The heat sink 14 is referred to also as a heat dissipation plate. In the present embodiment, the heat sinks 14 are provided so as to include the corresponding semiconductor chips 12 in a projected view along the Z-direction. The heat sinks 14 are disposed closer to the one surface 11a of the sealing resin body 11 than the corresponding semiconductor chips 12 in the Z-direction.

Each of the heat sinks 14 is electrically connected to the collector electrode 13a of the corresponding semiconductor chip 12 via a solder 15. The major part of the heat sink 14 is covered with the sealing resin body 11. Of the surfaces of the heat sink 14, a heat dissipation surface 14a opposite to the semiconductor chip 12 is exposed from the sealing resin body 11. The heat dissipation surface 14a is generally flush with the one surface 11a. Of the surfaces of the heat sink 14, the portion other than the portion connected to the solder 15 and the heat dissipation surface 14a is covered with the sealing resin body 11.

In the present embodiment, the heat sinks 14 include a heat sink 14H included in the upper arm 10H and a heat sink 14L included in the lower arm 10L. To the surface of the heat sink 14H opposite to the heat dissipation surface 14a, the respective collector electrodes 13a of the semiconductor chips 120H and 121H are connected via the solders 15. Also, to the surface of the heat sink 14L opposite to the heat dissipation surface 14a, the respective collector electrodes 13a of the semiconductor chips 120L and 121L are connected via the solders 15. The heat sinks 14H and 14L are disposed to be arranged in the X-direction, while being disposed at substantially the same positions in the Z-direction. The respective heat dissipation surfaces 14a of the heat sinks 14H and 14L are exposed from the one surface 11a of the sealing resin body 11, while being arranged in the X-direction.

Each of the terminals 16 is interposed between the corresponding semiconductor chip 12 and the heat sink 18. The terminal 16, which is located at an intermediate position on a thermal/electrical conduction path between the semiconductor chip 12 and the heat sink 18, is formed using at least a metal material so as to ensure a thermal conductivity and an electrical conductivity. The terminals 16 are disposed to face the emitter electrodes 13b and electrically connected to the emitter electrodes 13b via solders 17. The terminals 16 are correspondingly provided for the semiconductor chips 12 on a one-to-one basis.

Each of the heat sinks 18 also has the function of dissipating heat from the corresponding semiconductor chip 12 to the outside of the semiconductor device 10 and has the function of a wire. The heat sink 18 is referred to also as a heat dissipation plate. In the present embodiment, the heat sinks 18 are provided so as to include the corresponding semiconductor chips 12 in a projected view along the Z-direction. The heat sinks 18 are disposed closer to the back surface 11b of the sealing resin body 11 than the corresponding semiconductor chips 12 in the Z-direction.

Each of the heat sinks 18 is electrically connected to the emitter electrode 13b of the corresponding semiconductor chip 12. Specifically, the heat sink 18 is electrically connected to the emitter electrode 13b via the solder 17, the terminal 16, and a solder 19. The major part of the heat sink 18 is covered with the sealing resin body 11. Of the surfaces of the heat sink 18, a heat dissipation surface 18a opposite to the semiconductor chip 12 is exposed from the sealing resin body 11. The heat dissipation surface 18a is generally flush with the back surface 11b. Of the surfaces of the heat sink 18, the portion other than the portion connected to the solder 19 and the heat dissipation surface 18a is covered with the sealing resin body 11.

In the present embodiment, the heat sinks 18 include a heat sink 18H included in the upper arm 10H and a heat sink 18L included in the lower arm 10L. To the surface of the heat sink 18H opposite to the heat dissipation surface 18a, the terminals 16 corresponding to the semiconductor chips 120H and 121H are connected via the solders 19. Also, to the surface of the heat sink 18L opposite to the heat dissipation surface 18a, the terminals 16 corresponding to the semiconductor chips 120L and 121L are connected via the solders 19. The heat sinks 18H and 18L are disposed to be arranged in the X-direction, while being disposed at substantially the same positions in the Z-direction. The respective heat dissipation surfaces 18a of the heat sinks 18H and 18L are exposed from the back surface 11b of the sealing resin body 11, while being arranged in the X-direction.

Thus, the semiconductor chips 120H and 121H included in the upper arm 10H are connected in parallel to each other between the heat sinks 14H and 18H. Accordingly, the heat sinks 14H and 18H correspond to a pair of upper-arm plates. Likewise, the semiconductor chips 120L and 121L included in the lower arm 10L are connected in parallel to each other between the heat sinks 14L and 18L. Accordingly, the heat sinks 14L and 18L correspond to a pair of lower-arm plates.

The joint part 20 electrically connects the heat sink 18H disposed closer to the emitter electrodes 13b of the semiconductor chips 120H and 121H and the heat sink 14L disposed closer to the collector electrodes 13a of the semiconductor chips 120L and 121L. In other words, the joint part 20 electrically connects the heat sink 18H included in the upper arm 10H which is disposed on the lower potential side of the semiconductor chips 120H and 121H and the heat sink 14L included in the lower arm 10L which is disposed on the higher potential side of the semiconductor chips 120L and 121L.

One end of the joint part 20 is continued to the vicinity of one end portion of the heat sink 18H closer to the heat sink 14L, which is one end thereof in the direction in which the semiconductor chips 120H and 121H are arranged. The other end of the joint part 20 is continued to the vicinity of one end portion of the heat sink 14L closer to the heat sink 18H, which is one end thereof in the direction in which the semiconductor chips 120L and 121L are arranged.

In the present embodiment, all the semiconductor chips 12 are aligned in a row along the X-direction. The heat sinks 14L and 18H are also disposed to be arranged in the X-direction in a projected view along the Z-direction. The joint part 20 extends in the X-direction in X-Y plan view. One end of the joint part 20 is continued to a side surface 18b of the heat sink 18H which is closer to the heat sink 14L. The other end of the joint part 20 is continued to a side surface 14b of the heat sink 14L which is closer to the heat sink 18H.

More specifically, the joint part 20 has a first joint part 200 continued to the heat sink 18H and a second joint part 201 continued to the heat sink 14L. The first joint part 200 is provided integrally with the heat sink 18H by processing the same metal plate. The first joint part 200 is thinner than the heat sink 18H so as to be covered with the sealing resin body 11. The first joint part 200 is continued to the heat sink 18H so as to be generally flush with the surface of the heat sink 18H which is closer to the semiconductor chip 12. The first joint part 200 has a thin plate shape and extends from the side surface 18b of the heat sink 18H in the X-direction.

The second joint part 201 is provided integrally with the heat sink 14L by processing the same metal plate. The second joint part 201 is thinner than the heat sink 14L so as to be covered with the sealing resin body 11. The second joint part 201 is continued to the surface of the heat sink 14L which is closer to the semiconductor chip 12 so as to be generally flush therewith. The second joint part 201 extends from the side surface 14b of the heat sink 14L toward the heat sink 18H. When viewed in the Z-direction, the second joint part 201 extends in the X-direction. In the present embodiment, as shown in FIG. 4, the second joint part 201 has two bent portions. The tip portion of the second joint part 201 overlaps the first joint part 200 in a projected view along the Z-direction. The second joint part 201 and the first joint part 200 are connected via a solder 202.

The main terminal 21 is an external connection terminal for connecting the semiconductor device 10 to the higher-potential power source line 5. The main terminal 21 is referred to also as a higher-potential power source terminal or a P-terminal. The main terminal 21 is continued to the heat sink 14H to extend from the heat sink 14H in the Y-direction. In the present embodiment, by processing the same metal plate, the main terminal 21 is provided integrally with the heat sink 14H. The main terminal 21 is continued to one end of the heat sink 14H in the Y-direction. The main terminal 21 has substantially the same thickness as that of the heat sink 14H. One surface of the main terminal 21 is continued to the heat dissipation surface 14a of the heat sink 14H to be generally flush therewith and exposed together with the heat dissipation surface 14a from the one surface 11a of the sealing resin body 11.

The main terminal 22 is an external connection terminal for connecting the semiconductor device 10 to the output line 7 of the motor 3. The main terminal 22 is referred to also as an output terminal or an O-terminal. The main terminal 22 is continued to the heat sink 14L to extend from the heat sink 14L in the Y-direction and on the same side as the main terminal 21. In the present embodiment, by processing the same metal plate, the main terminal 22 is provided integrally with the heat sink 14L. The main terminal 22 is continued to one end of the heat sink 14L in the Y-direction. The main terminal 22 has substantially the same thickness as that of the heat sink 14L. One surface of the main terminal 22 is continued to the heat dissipation surface 14a of the heat sink 14L to be generally flush therewith and exposed together with the heat dissipation surface 14a from the one surface 11a of the sealing resin body 11. In short, from the one surface 11a, the heat dissipation surfaces 14a of the heat sinks 14H and 14L and the main terminals 21 and 22 are exposed.

The main terminal 23 is an external connection terminal for connecting the semiconductor device 10 to the lower-potential power source line 6. The main terminal 23 is referred to also as a lower-potential power source terminal or an N-terminal. The main terminal 23 is continued to the heat sink 18L to extend from the heat sink 18L in the Y-direction and on the same side as the main terminal 21. In the present embodiment, by processing the same metal plate, the main terminal 23 is provided integrally with the heat sink 18L. The main terminal 23 is continued to one end of the heat sink 18L in the Y-direction. The main terminal 23 has substantially the same thickness as that of the heat sink 18L. One surface of the main terminal 23 is continued to the heat dissipation surface 18a of the heat sink 18L to be generally flush therewith and exposed together with the heat dissipation surface 18a from the back surface 11b of the sealing resin body 11. In short, from the back surface 11b, the heat dissipation surfaces 18a of the heat sinks 18H and 18L and the main terminal 23 are exposed.

The main terminal 23 has a portion overlapping the main terminal 21 in a projected view along the Z-direction. Briefly, in the Z-direction, a multi-layer structure including the main terminal 21 (P-terminal) and the main terminal 23 (N-terminal) is formed. Specifically, the main terminal 21 extends from the portion of one side surface of the heat sink 14H along the Y-direction which is closer to the lower arm 10L. In other words, the main terminal 21 extends from the portion closer to the semiconductor chip 120H than to the semiconductor chip 121H. The main terminal 21 extends in the Y-direction such that the tip thereof approaches the lower arm 10L in the X-direction. In short, the main terminal 21 extends diagonally.

On the other hand, the main terminal 23 extends from the portion of one side surface of the heat sink 18L along the Y-direction which is closer to the upper arm 10H. In other words, the main terminal 23 extends from the portion closer to the semiconductor chip 120L than to the semiconductor chip 121L. The main terminal 23 extends in the Y-direction such that the tip thereof approaches the upper arm 10H in the X-direction. In short, the main terminal 23 extends diagonally. The respective tip portions of the main terminals 21 and 23 overlap each other in a projected view along the Z-direction.

The signal terminals 24 are electrically connected to the pads 13c of the corresponding semiconductor chips 12 via bonding wires 25. In the present embodiment, the aluminum-based bonding wires 25 are used. The signal terminals 24 are connected to the bonding wires 25 in the sealing resin body 11 to protrude from the side surface 11c of the sealing resin body 11 to the outside.

In the present embodiment, the signal terminals 24 include signal terminals 24H included in the upper arm 10H and signal terminals 24L included in the lower arm 10L. The signal terminals 24H are electrically connected to the pads 13c of the corresponding semiconductor chips 120H and 121H. The signal terminals 24L are electrically connected to the pads 13c of the corresponding semiconductor chips 120L and 121L. The signal terminals 24H corresponding to the individual semiconductor chips 120H and 121H extend in the same direction. Also, the signal terminals 24L corresponding to the individual semiconductor chips 120L and 121L extend in the same direction.

More specifically, all the semiconductor chips 12 are aligned in a row along the X-direction. Also, the pads 13c of the individual semiconductor chips 12 are disposed on the same side in the Y-direction. Accordingly, the signal terminals 24H and the signal terminals 24L extend in the same direction. The signal terminals 24H and the signal terminals 24L extend in a direction which is the Y-direction and opposite to the direction in which the main terminals 21, 22, and 23 extend relative to the heat sinks 14H, 14L, and 18H.

In the semiconductor device 10 thus configured, the sealing resin body 11 integrally seals the semiconductor chips 12, respective portions of the heat sinks 14, the terminals 16, respective portions of the heat sinks 18, respective portions of the main terminals 21, 22, and 23, and respective portions of the signal terminals 24. The sealing resin body 11 seals the semiconductor chips 120H, 120L, 121H, and 121L. In other words, the sealing resin body 11 seals the one upper arm 10H and the one lower arm 10L which form a pair of the upper and lower arms corresponding to one phase. Accordingly, the semiconductor device 10 is referred to also as a 2-in-1 package.

The heat sinks 14 and 18 have been subjected to a cutting process together with the sealing resin body 11. The one surface 11a and the heat dissipation surfaces 14a are cut surfaces. The respective heat dissipation surfaces 14a of the heat sinks 14H and 14L are located in the same plane and generally flush with the one surface 11a of the sealing resin body 11. Likewise, the back surface 11b and the heat dissipation surfaces 18a are cut surfaces. The respective heat dissipation surfaces 18a of the heat sinks 18H and 18L are located in the same plane and generally flush with the back surface 11b of the sealing resin body 11. Thus, the semiconductor device 10 has a double-surface heat dissipation structure in which both of the heat dissipation surfaces 14a and 18a are exposed from the sealing resin body 11.

In the present embodiment, as described above, the respective surfaces of the main terminals 21 and 22 which are continued to the heat dissipation surfaces 14a are also cut surfaces. The surface of the main terminal 23 which is continued to the heat dissipation surface 18a is also a cut surface. The semiconductor device 10 thus configured can be formed by a known manufacturing method.

Next, on the basis of FIGS. 3 to 5, a description will be given of the details of the upper arm 10H, the lower arm 10L, and a series-connecting part 26 which connects the upper arm 10H the lower arm 10L in series.

As described above, the heat sinks 14H and 14L are disposed to be arranged in the X-direction. Also, the semiconductor chips 120H, 120L, 121H, and 121L are aligned in a row along the X-direction. The semiconductor chip 121H, the semiconductor chip 120H, the semiconductor chip 120L, and the semiconductor chip 121L are disposed to be arranged in this order in the X-direction. The joint part 20 extends in the X-direction in X-Y plan view to couple the side surface 18b of the heat sink 18H to the side surface 14b of the heat sink 14L.

The upper arm 10H is configured to include the heat sinks 14H and 18H as the pair of upper-arm plates and the semiconductor chips 120H and 121H. In the X-direction, the semiconductor chip 120H is closer to the joint part 20, while the semiconductor chip 121H is further away from the joint part 20. In other words, in the X-direction, the semiconductor chips 120H and 121H are at different distances from the joint part 20. The portion of the heat sink 14H which is located between the portion thereof connected to the semiconductor chip 120H via the solder 15 and the portion thereof connected to the semiconductor chip 121H via the solder 15 serves as a parallel-connecting part 140H closer to the collector electrode 13*a*. Likewise, the portion of the heat sink 18H which is located between the portion thereof connected to the semiconductor chip 120H via the solder 19 and the portion thereof connected to the semiconductor chip 121H via the solder 19 serves as a parallel-connecting part 180H closer to the emitter electrode 13*b*. In FIG. 4, the portions interposed between the broken lines correspond to the parallel-connecting parts 140H and 180H.

The upper arm 10H includes not only the components mentioned above, but also the solders 15, 17, and 19 and the terminals 16. However, as described above, each of the semiconductor chip 120H and the semiconductor chip 121H has the same connection structure (multi-layer structure) between the pair of heat sinks 14H and 18H in the Z-direction.

The lower arm 10L is configured to include the heat sinks 14L and 18L as the pair of lower-arm plates and the semiconductor chips 120L and 121L. In the X-direction, the semiconductor chip 120L is closer to the joint part 20, while the semiconductor chip 121L is further away from the joint part 20. In other words, in the X-direction, the semiconductor chips 120L and 121L are at different distances from the joint part 20. The portion of the heat sink 14L which is located between the portion thereof connected to the semiconductor chip 120L via the solder 15 and the portion thereof connected to the semiconductor chip 121L via the solder 15 serves as a parallel-connecting part 140L closer to the collector electrode 13*a*. Likewise, the portion of the heat sink 18L which is located between the portion thereof connected to the semiconductor chip 120L via the solder 19 and the portion thereof connected to the semiconductor chip 121L via the solder 19 serves as a parallel-connecting part 180L closer to the emitter electrode 13*b*. The parallel-connecting part 180L also has the same configuration as that of the parallel-connecting part 180H. In FIG. 4, the portions interposed between the broken lines correspond to the parallel-connecting parts 140L and 180L.

The lower arm 10L includes not only the components mentioned above, but also the solders 15, 17, and 19 and the terminals 16. However, as described above, each of the semiconductor chip 120L and the semiconductor chip 121L has the same connection structure (multi-layer structure) between the pair of heat sinks 14L and 18L in the Z-direction.

In the X-direction, between the joint part 20 and the semiconductor chip 120H, there is a predetermined gap. Specifically, in the X-direction, between the side surface 18*b* and the semiconductor chip 120H, there is the gap. Likewise, in the X-direction, between the joint part 20 and the semiconductor chip 120L, there is a predetermined gap. Specifically, in the X-direction, between the side surface 14*b* and the semiconductor chip 120L, there is the gap. Thus, in the present embodiment, the joint part 20, the portion of the heat sink 18H which is located between the side surface 18*b* and the semiconductor chip 120H, and the portion of the heat sink 14L which is located between the side surface 14*b* and the semiconductor chip 120L form the series-connecting part 26 which connects the upper arm 10H and the lower arm 10L in series.

The parallel-connecting parts 140H and 140L have substantially equal lengths (path lengths) in the X-direction as the direction in which a current flows. The parallel-connecting parts 180H and 180L have substantially equal lengths in the X-direction as the direction in which a current flows. The lengths of the parallel-connecting parts 140H and 140L in the X-direction are slightly different from the lengths of the parallel-connecting parts 180H and 180L in the X-direction. However, for the sake of convenience, the lengths of all the parallel-connecting parts 140H, 140L, 180H, and 180L in the X-direction are denoted by A1. The heat sinks 14H, 14L, 18H, and 18L have substantially equal widths as lengths along the Y-direction and substantially equal thicknesses as lengths along the Z-direction. Accordingly, the respective widths of all the parallel-connecting parts 140H, 140L, 180H, and 180L have substantially equal values denoted by B1. Also, the respective thicknesses of the parallel-connecting parts 140H, 140L, 180H, and 180L have substantially equal values denoted by C1.

Figure 5:
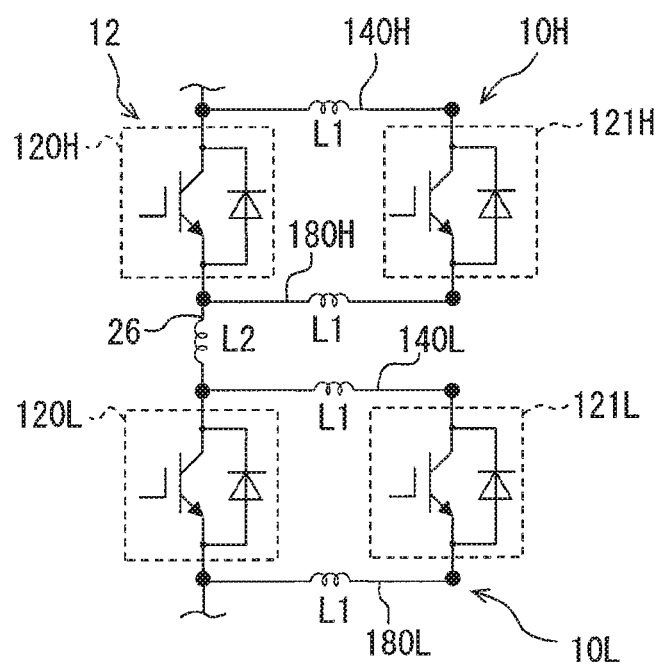
FIG. 5 is an equivalent circuit diagram of an upper-arm circuit and a lower-arm circuit.

As a result, an equivalent circuit of the upper arm 10H, the lower arm 10L, and the series-connecting part 26 can be shown as in FIG. 5. As described above, the upper arm 10H and the lower arm 10L have the slightly different lengths A1, but have the equal widths B1 and the equal thicknesses C1. Accordingly, in FIG. 5, for the sake of convenience, the respective inductances of the parallel-connecting parts 140H, 140L, 180H, and 180L are denoted by L1. On the other hand, the inductance of the series-connecting part 26 is denoted by L2. The upper arm 10H is connected to the higher-potential power source line 5 via the main terminal 21. The lower arm 10L is connected to the lower-potential power source line 6 via the main terminal 23.

As shown in FIG. 4, the length A1 is shorter than the length (path length) A2 in the direction in which a current flows in the series-connecting part 26. Strictly speaking, the length A1 of each of the longer parallel-connecting parts 180H and 180L which are closer to the emitter electrodes 13*b*, i.e., the maximum value of the length A1 is shorter than the length A2. Note that, in FIG. 4, the length A2 is shown by the double-headed arrow.

As shown in FIG. 3, the width B1 is larger than a width B2 of the joint part 20 as the main component of the series-connecting part 26. As shown in FIG. 4, the thickness C1 is larger than the thickness of at least one of the first joint part 200 and the second joint part 201 which are included in the joint part 20. In the present embodiment, the thickness C1 is larger than the thickness C2 of the second joint part 201. The thickness C1 is also larger than the thickness of the first joint part 200. Consequently, the respective inductances L1 of the parallel-connecting parts 140H, 140L, 180H, and 180L are smaller than the inductance L2 of the series-connecting part 26.

Next, a description will be given of the effects of the semiconductor device 10 described above.

In the present embodiment, the pads 13*c* of the semiconductor chips 120H and 121H connected in parallel are formed on the same side of the emitter electrodes 13*b* as the main electrodes. Also, the signal terminals 24H corresponding to the individual semiconductor chips 120H and 121H extend on the same side of the emitter electrodes 13*b* in the Y-direction. Likewise, the pads 13*c* of the semiconductor chips 120L and 121L connected in parallel are formed on the same side of the emitter electrodes 13*b* as the main electrodes. Also, the signal terminals 24L corresponding to the individual semiconductor chips 120L and 121L extend on the same side of the emitter electrodes 13*b* in the Y-direction. Thus, in the same arm, the signal terminals 24 extend in the same direction. This allows the connection structure between the signal terminals 24 and the outside (external device) to be simplified.

In the present embodiment, the respective inductances L1 of the parallel-connecting parts 140H, 140L, 180H, and 180L are smaller than the inductance L2 of the series-connecting part 26 including the joint part 20. For example, when it is assumed that the inductance L2 of the series-connecting part 26 has a predetermined value, the inductance L1 can be reduced compared to that in a configuration in which the inductance L1 is set to be equal to or larger than the inductance L2. This can suppress current variation, while allowing the layout of the pads 13c described above to be used. Since the resistive component of main circuit wiring exerts greater influence on the emitter side than on the collector side, by particularly setting the respective inductances L1 of the parallel-connecting parts 180H and 180L smaller than the inductance L2, it is possible to suppress current variation.

In addition, by satisfying the relationship given by L1<L2, it is possible to inhibit abnormal gate oscillation. Since a gate resistance or the like need not be inserted in series in a gate, it is possible to suppress abnormal gate oscillation, while suppressing an increase in switching loss. In this respect, an effect is actually recognized in the experiment performed using the configuration of the present disclosure.

Figure 6:
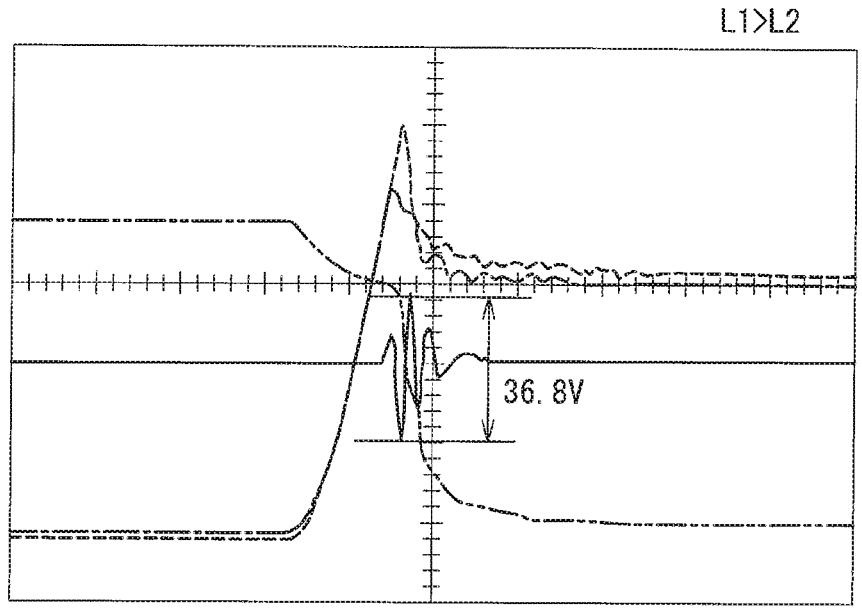
FIG. 6 is a view showing signal waveforms in a comparative example.
Figure 7:
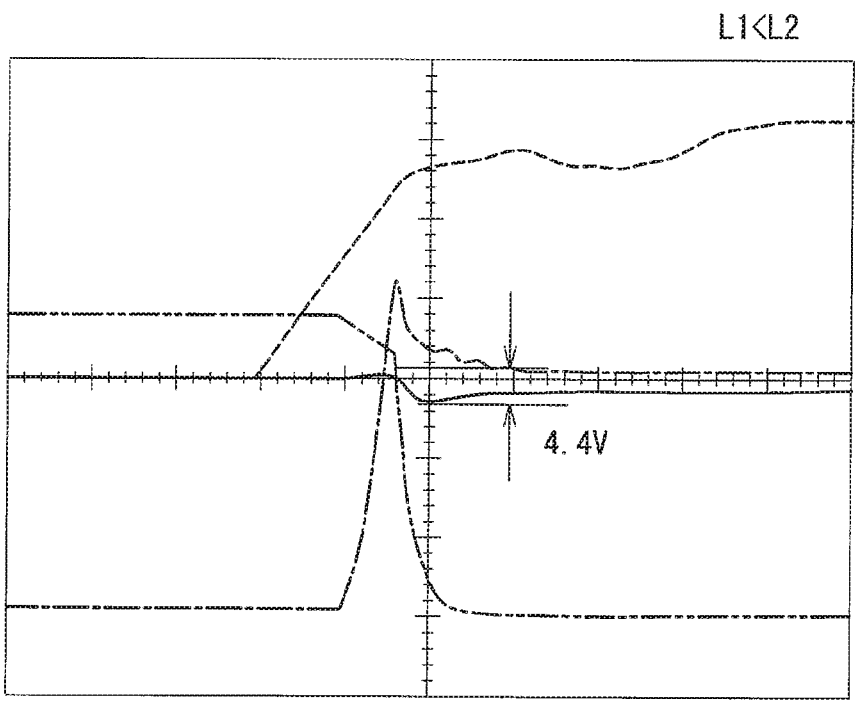
FIG. 7 is a view showing signal waveforms of the semiconductor device according to the first embodiment.

FIG. 6 shows signal waveforms in a comparative example of the present embodiment. FIG. 7 shows signal waveforms in the semiconductor device 10 in the present embodiment. Each of the signal waveforms is obtained at a turn-ON time. In FIG. 6, the solid line shows a voltage between the Kelvin emitters of semiconductor chips connected in parallel, the broken line shows Ice in the semiconductor chip closer to the joint part, the one-dot-dash line shows Ice in the semiconductor chip further away from the joint part, and the two-dot-dash line shows Vce. In FIG. 7, the solid line shows a voltage between the Kelvin emitters, the broken line shows Vge, the one-dot-dash line shows the sum of currents Ice allowed to flow in the semiconductor chips connected in parallel, and the two-dot-dash line shows Vce. The inductances L2 were fixed at 3 nH. In the comparative example, the inductance L1 was set to 20 nH while, in the example of the present embodiment, the inductance L1 was set to 1 nH. In the comparative example, L1>L2 was satisfied in basically the same configuration as that in the present embodiment.

As shown in FIGS. 6 and 7, it was proved that, in the comparative example in which L1>L2 was satisfied, abnormal gate oscillation occurred while, in the example of the present embodiment in which L1<L2 was satisfied, abnormal gate oscillation could be suppressed. Note that the amplitude of the voltage between the Kelvin emitters was 36.8 V in the comparative example and was 4.4 V in the example of the present embodiment. The waveforms at the turn-ON time are shown by way of example, but it can be considered that the same result can be obtained even at a turn-OFF time.

Thus, in the semiconductor device 10 in the present embodiment 10, it is possible to suppress current variation and abnormal gate oscillation, while allowing the connection structure between the signal terminals 24 and the outside to be simplified. In particular, since a gate resistance or the like need not be inserted in series in the gate, it is possible to allow an increase in switching frequency (high-speed switching). Accordingly, it is possible to suppress abnormal gate oscillation, while suppressing an increase in switching loss.

In addition to the above, in the present embodiment, not only the semiconductor chips 120H and 121H, but also the semiconductor chips 120L and 121L are disposed to be arranged in the X-direction. Also, the layout of the pads 13c relative to the emitter electrodes 13b is the same in each of the upper arm 10H and the lower arm 10L. In addition, all the signal terminals 24H and 24L extend in the same direction. This allows the connection structure between the signal terminals 24 and the outside (external device) to be further simplified.

Moreover, all the semiconductor chips 12 are aligned in a row along the X-direction. This allows the connection structure between the signal terminals 24 and the outside (external device) to be further simplified. This also allows the size of the semiconductor device 10 in the Y-direction to be reduced.

The self-inductance L (µH) of a flat plate having a length l, a width w, and a thickness t can be given by the following known expression.

$$L=0.0002\times l\times[\ln\{2l/(w+t)\}+\tfrac{1}{2}+0.22(w+t)/l]$$ (Expression 1)

Thus, between the inductance L and the length l, a generally proportional relationship is established. Between the inductance L and 1/w, a generally proportional relationship is established. Between the inductance L and 1/t, a generally proportional relationship is established. Accordingly, by satisfying at least one of the foregoing relationships given by Length A1<A2, Width B1>B2, and Thickness C1>C2, the relationship given by L1<L2 may be established appropriately.

In the present embodiment, the length A1 of each of the parallel-connecting parts 140H, 140L, 180H, and 180L is shorter than the length A2 of the series-connecting part 26. As shown in Expression 1, the length l is most influential on the inductance L. Accordingly, by satisfying A1<A2, it is possible to satisfy Inductance L1<inductance L2. Particularly in the present embodiment, the length A1 is shorter than the extension length of the joint part 20. This allows Inductance L1<Inductance L2 to be more reliably satisfied.

In the present embodiment, the width B1 of each of the parallel-connecting parts 140H, 140L, 180H, and 180L is larger than the width B2 of the joint part 20 as the main component of the series-connecting part 26. This also allows Inductance L1<Inductance L2 to be satisfied.

In the present embodiment, the thickness C1 of each of the parallel-connecting parts 140H, 140L, 180H, and 180L is larger than the thickness of at least one of the first joint part 200 and the second joint part 201 which are included in the joint part 20. Specifically, the thickness C1 is larger than the thickness C2 of the second joint part 201. The thickness C1 is also larger than the thickness of the first joint part 200. This also allows Inductance L1<Inductance L2 to be satisfied. Note that, when the switching frequency is increased, due to a skin effect, currents flow only in the surface layers of the heat sinks 14H, 14L, 18H, and 18L. Accordingly, it is preferable to satisfy the foregoing relationship in width rather than in thickness.

In the present embodiment, the respective tip portions of the main terminals 21 and 23 overlap each other in a projected view along the Z-direction. Accordingly, using a magnetic flux cancellation effect, it is possible to reduce an inductance Lp of the main terminal 21 (P-terminal) and an inductance Ln of the main terminal 23 (N-terminal) which have high contributions to the inductance of the main circuit. This can also inhibit an oscillation phenomenon resulting from the inductance Lp or Ln. Specifically, it is possible to inhibit, at the turn-OFF time, a spike voltage resulting from the inductance Lp or Ln from forming an oscillation circuit in conjunction with an inductance Lg of the gate via a parasitic capacitance between the gate and the collector and causing the oscillation phenomenon.

Note that, to reduce the inductances Lp and Ln, it is appropriate to reduce an interlinked loop 27 shown by the one-dot-dash line in FIG. 3 within the limits of an insulation creepage distance. The interlinked loop 27 is the portion surrounded by the main terminal 21, the joint part 20, and the main terminal 23 in X-Y plan view. When the interlinked loop 27 is reduced in size, the deposit areas of the main terminals 21 and 23 can be increased. This can enhance the magnetic flux cancellation effect and further reduce the inductances Lp and Ln.

Second Embodiment

For the present embodiment, the previous embodiment can be referred to. Accordingly, a description of components which are common to those of the semiconductor device 10 shown in the previous embodiment is omitted.

Figure 8:
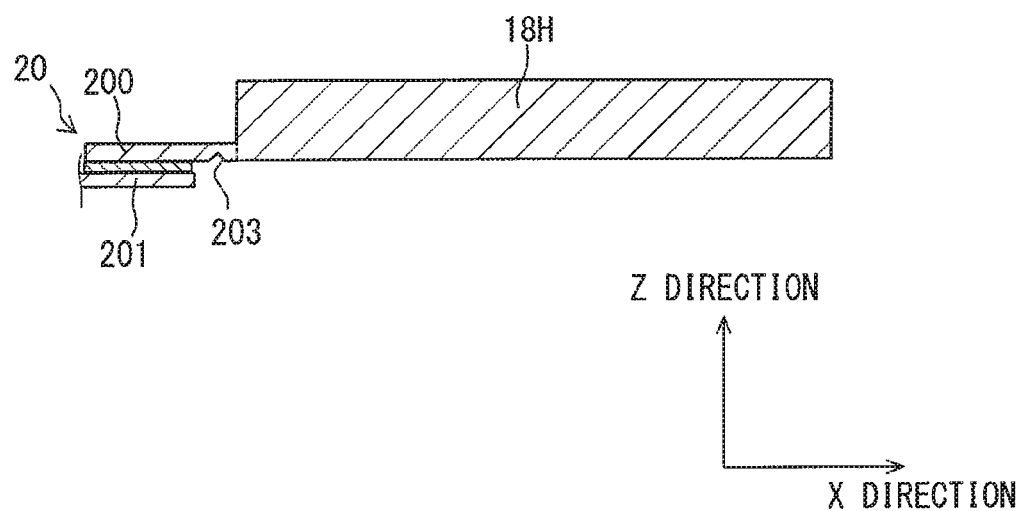
FIG. 8 is a cross-sectional view showing the vicinity of a first joint part in a semiconductor device according to a second embodiment.

In the semiconductor device 10 in the present embodiment, the surface of the joint part 20 has an uneven shape. FIG. 8 shows an example of the present embodiment. In FIG. 8, in the portion of the surface of the first joint part 200 connected to a solder which is closer to the end thereof continued to the heat sink 18H, a depressed portion 203 is formed. The depressed portion 203 is formed in the portion of the first joint part 200 which is in contact with the solder 202 to serve as a current path. The depressed portion 203 extends in the Y-direction, though the depiction thereof is omitted. The depressed portion 203 is formed to extend from one end of the first joint part 200 to the other end thereof in the Y-direction. The depressed portion 203 can be formed by, e.g., pressing or etching.

By thus using the joint part 20 having the depressed portion 203, the current path can be elongated in the joint part 20. This can increase the inductance L2, while suppressing a size increase. As a result of increasing the inductance L2, the relationship given by L1<L2 is more easily satisfied.

In addition, the sealing resin body 11 enters the depressed portion 203 to cause an anchoring effect. This can also enhance the adhesion of the sealing resin body 11 to the joint part 20.

Note that, instead of the depressed portion 203, a protruding portion may also be provided. The uneven shape is not limited to that of the first joint part 200. It is sufficient for at least one of the first joint part 200 and the second joint part 201 to have the uneven shape. For example, the depressed portion 203 may also be provided in the portion of the second joint part 201 which is closer to the end thereof continued to the heat sink 14L.

Third Embodiment

For the present embodiment, the previous embodiments can be referred to. Accordingly, a description of components which are common to those of the semiconductor device 10 shown in each of the previous embodiments is omitted.

Figure 9:
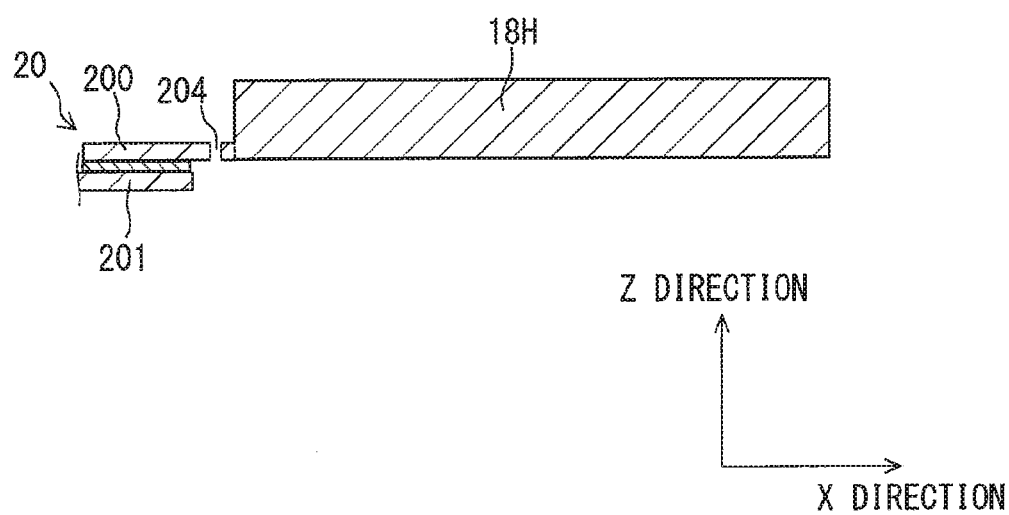
FIG. 9 is a cross-sectional view showing the vicinity of a first joint part in a semiconductor device according to a third embodiment.

In the present embodiment, the joint part 20 has through holes. FIG. 9 shows an example of the present embodiment. In FIG. 9, through holes 204 are formed in the portion of the first joint part 200 which is closer to the end thereof continued to the heat sink 18H. Similarly to the depressed portion 203, the through holes 204 are formed in the portion of the first joint part 200 which is in contact with the solder 202 to serve as the current path. In the first joint part 200, the plurality of through holes 204 are formed, though the depiction thereof is omitted. The plurality of through holes 204 are formed at predetermined intervals in the Y-direction. The through holes 204 can also be formed by, e.g., pressing or etching.

By thus using the joint part 20 having the through holes 204, the width of the current path can be reduced in the joint part 20. This can increase the inductance L2, while suppressing a size increase. As a result of increasing the inductance L2, the relationship given by L1<L2 is more easily satisfied.

In addition, since the sealing resin body 11 enters and fills the through holes 204, the resulting anchoring effect allows the adhesion of the sealing resin body 11 to the joint part 20 to be enhanced.

Note that it is sufficient for the through holes 204 to be formed in at least one of the first joint part 200 and the second joint part 201. For example, the through holes 204 may also be provided in the portion of the second joint part 201 which is closer to the end thereof continued to the heat sink 14L.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

Each of the above embodiments has shown the example in which the IGBT and the FWD are formed in the same chip. However, the present disclosure can also be applied to a configuration in which the IGBT and the FWD are formed in different chips.

Also, each of the above embodiments has shown the example in which the semiconductor device 10 has the terminals 16. However, the semiconductor device 10 may also have a configuration which does not have the terminals 16. In this case, it may be possible to provide the heat sinks 18 with protruding portions protruding toward the emitter electrodes 13b.

Each of the above embodiments has shown the example in which the heat dissipation surfaces 14a and 18a are exposed from the sealing resin body 11. However, the present disclosure can be also applied to a configuration in which the heat dissipation surfaces 14a and 18a are not exposed from the sealing resin body 11. Also, each of the above embodiments has shown the example in which the one surface 11a and the back surface 11b of the sealing resin body 11 and the heat dissipation surfaces 14a and 18a are cut surfaces, but the present disclosure is not limited thereto. For example, the sealing resin body 11 may also be molded such that the heat dissipation surfaces 14a and 18a come in contact with, e.g., the wall surfaces of a mold die forming a cavity.

Each of the above embodiments has shown the example in which the main terminals 21, 22, and 23 are continued to the heat dissipation surfaces 14a and 18a of the corresponding heat sinks 14 and 18 and exposed from the one surface 11a or the back surface 11b of the sealing resin body 11. However, it is also possible to adopt a configuration in which the main terminals 21, 22, and 23 are not exposed from the one surface 11a and the back surface 11b, but protrude from the side surface of the sealing resin body 11 to the outside.

Each of the above embodiments has shown the example in which the two semiconductor chips 12 are connected in parallel between the pair of heat dissipation plates, but the configuration is not limited thereto. The present disclosure can be also applied to a configuration in which the three or more semiconductor chips 12 are connected in parallel between the pair of heat dissipation plates. In this case, it is sufficient for the inductance L1 of the parallel-connecting part between the semiconductor chip 12 closest to the joint part 20 among the three or more semiconductor chips 12 connected in parallel between the pair of heat dissipation plates and the semiconductor chip 12 most distant from the joint part 20 thereamong to be set smaller than the inductance L2 of the series-connecting part 26.

Figure 10:
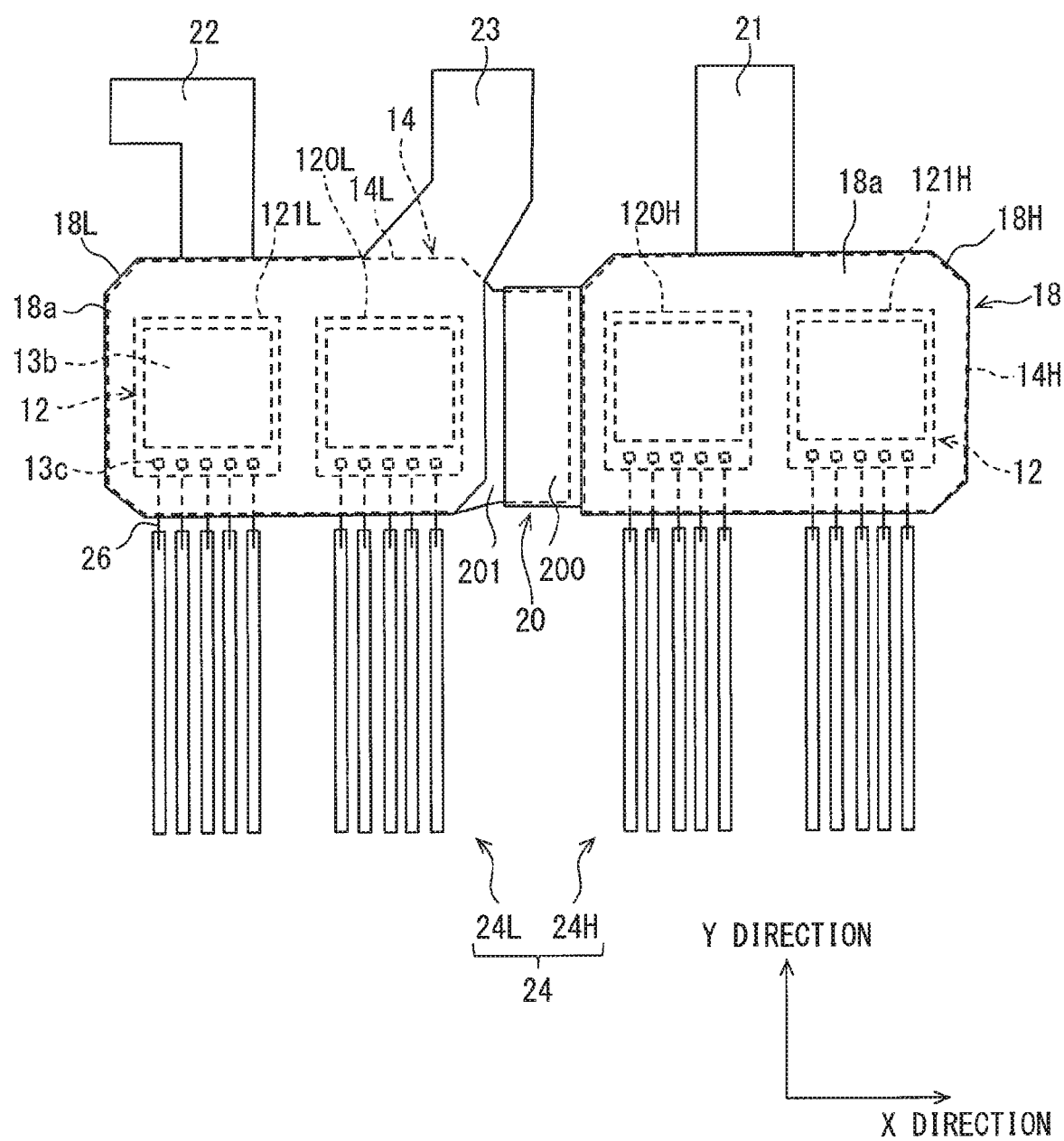
FIG. 10 is a plan view showing a first modification, and corresponding to FIG. 3.

Each of the above embodiments has shown the example in which the main terminals 21 and 23 overlap each other in a projected view along the Z-direction. However, it is also possible to adopt a configuration in which, as shown in, e.g., a first modification in FIG. 10, the main terminals 21 and 23 are disposed apart from each other so as not to overlap each other in a projected view along the Z-direction. In FIG. 10, in the X-direction, between the main terminal 21 (P-terminal) and the main terminal 22 (O-terminal), the main terminal 23 (N-terminal) is disposed. Briefly, since the main terminal 23 is disposed adjacent to the main terminal 21, a rather significant magnetic flux cancellation effect is achieved.

Each of the above embodiments has shown the example in which all the semiconductor chips 12 are disposed to be arranged in the X-direction, and the joint part 20 extending in the X-direction in X-Y plan view is continued to the side surface 14b of the heat sink 14L as one end of the heat sink 14L in the direction in which the semiconductor chips 120L and 121L are arranged and to the side surface 18b of the heat sink 18H as one end of the heat sink 18H in the direction in which the semiconductor chips 120H and 121H are arranged. However, the arrangement of the semiconductor chips 12 and the extending direction of the joint part 20 are not limited to those in the foregoing example. It is also possible to adopt a configuration in which, e.g., all the semiconductor chips 12 are disposed to be arranged in the X-direction and the semiconductor chips 12 included in the upper arm 10H are shifted from the semiconductor chips 12 included in the lower arm 10L in the Y-direction, i.e., the semiconductor chips 12 included in the upper arm 10H and the semiconductor chips 12 included in the lower arm 10L are not aligned in a row. It is also possible to adopt a configuration shown in, e.g., a second modification in FIG. 11.

Figure 11:
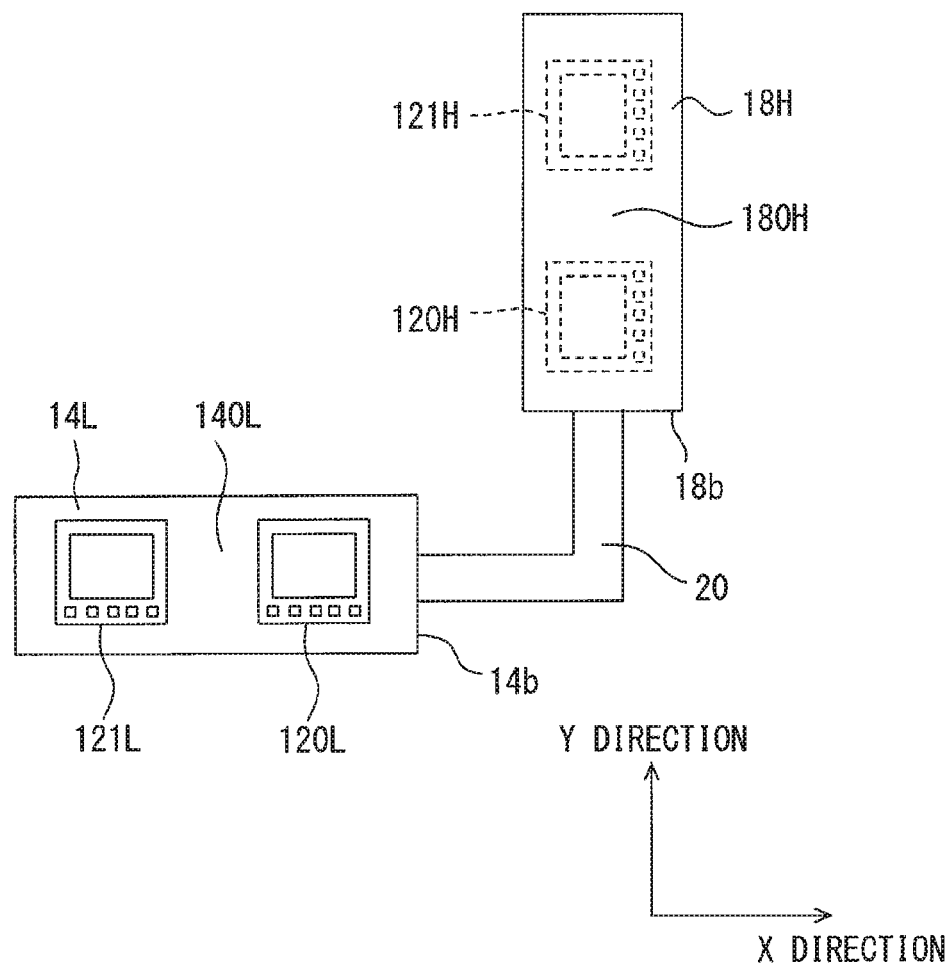
FIG. 11 is a plan view showing a second modification.

In FIG. 11, the semiconductor chips 120H and 121H are disposed to be arranged in the X-direction, while the semiconductor chips 120L and 121L are disposed to be arranged in the Y-direction. Also, the side surface 14b is perpendicular to the X-direction, while the side surface 18b is perpendicular to the Y-direction. The joint part 20 is bent in an L-shaped two-dimensional shape so as to be continued to the both side surfaces 14b and 18b. In such a configuration also, the signal terminals 24H included in the upper arm 10H extend in the same direction, while the signal terminals 24L included in the lower arm 10L extend in the same direction. Consequently, it is possible to suppress current variation and abnormal gate oscillation, while allowing the connection structure between the signal terminals 24 and the outside to be simplified. Note that, in FIG. 11, the path length of the joint part 20 is larger than the lengths A1 of the connecting parts 140H, 140L, 180H, and 180L. Also, the widths B1 of the connecting parts 140H, 140L, 180H, and 180L are larger than the width B2 of the joint part 20.

Figure 12:
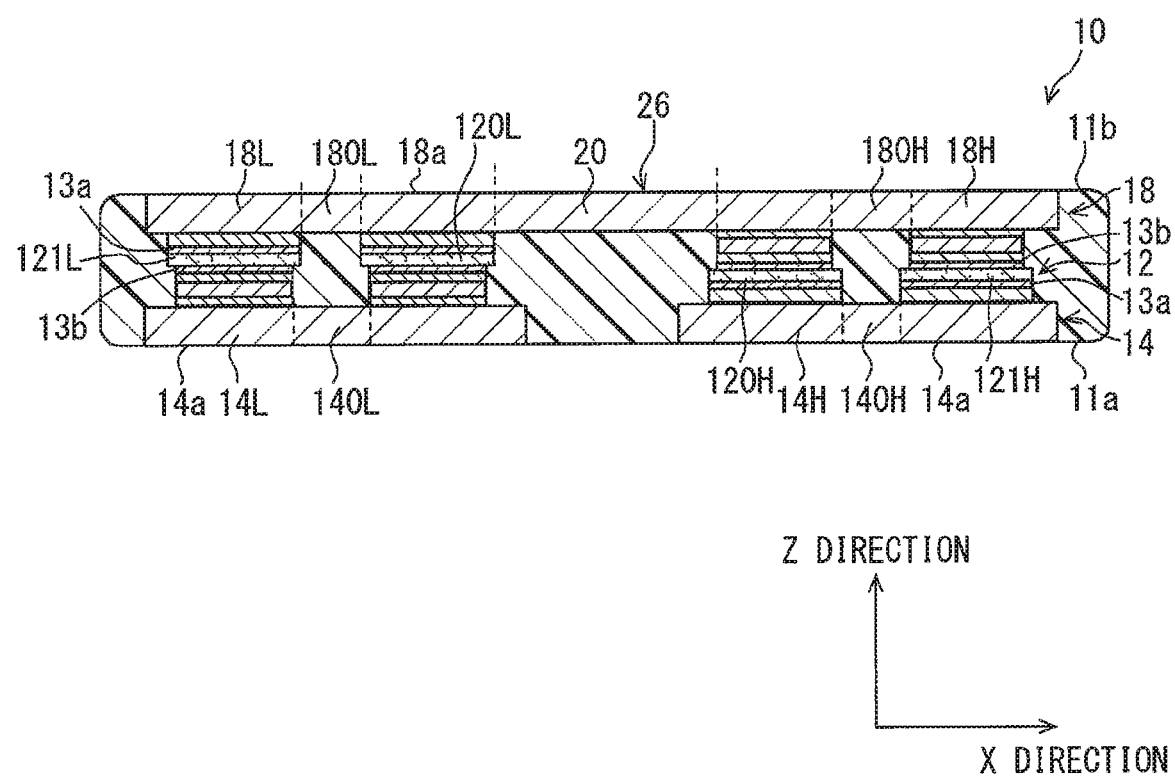
FIG. 12 is a cross-sectional view showing a third modification, and corresponding to FIG. 4.

Each of the above embodiments has shown the example in which all the semiconductor chips 12 are disposed such that each of the semiconductor chips 12 included in the upper arm 10H and the semiconductor chips 12 included in the lower arm 10L has the same positional relationship between the one surface and the back surface thereof, i.e., the same positional relationship between the collector 13a and the emitter electrode 13b thereof. However, the present disclosure can also be applied to a configuration as shown in, e.g., a third modification in FIG. 12 in which the positional relationship between the one surface and the back surface of each of the semiconductor chips 12 included in the upper arm 10H is reversed compared to that of each of the semiconductor chips 12 included in the lower arm 10L. In FIG. 12, the collector electrodes 13a of the semiconductor chips 120H and 121H are closer to the heat sink 14H, while the collector electrodes 13a of the semiconductor chips 120L and 121L are closer to the heat sink 18L.

In FIG. 12, the heat sinks 18H and 18L are formed of one heat dissipation plate. In the heat dissipation plate, the portion located between the heat sinks 18H and 18L serves as the joint part 20. The series-connecting part 26 is formed only of the joint part 20. The joint part 20 is the portion of the heat dissipation plate which is located between the semiconductor chips 120H and 120L and closer to the joint part 20. Accordingly, by setting the path length of the joint part 20 larger than the length A1 of each of the parallel-connecting parts 140H, 140L, 180H, and 180L, it is possible to set the inductance L1 smaller than the inductance L2.

Each of the above embodiments has shown the example in which the joint part 20 has the first joint part 200 continued to the heat sink 18H and the second joint part 201 continued to the heat sink 14L. However, it is sufficient for the joint part 20 to have at least one of the first joint part 200 and the second joint part 201. For example, it is also possible to adopt a configuration in which the joint part 20 has only the first joint part 200, and the first joint part 200 extending from the heat sink 18H is connected to the heat sink 14L.

The invention claimed is:

1. A semiconductor device, comprising:
a pair of upper-arm plates and a pair of lower-arm plates, each serving as a pair of heat dissipation plates;
a plurality of upper-arm chips and a plurality of lower-arm chips which is the same in number as the upper-arm chips, each of the upper- and lower-arm chips being a semiconductor chip in which a switching element is formed and which has main electrodes respectively formed on a one surface and a back surface opposite to the one surface in a thickness direction and has a signal pad formed at a position on the back surface different from a position of the main electrode on the back surface, the main electrode on the one surface being electrically connected to one of the pair of heat dissipation plates, the main electrode on the back surface being electrically connected to the other of the pair of heat dissipation plate, the upper-arm chips being arranged in a first direction perpendicular to the thickness direction and connected in parallel to each other between the pair of upper-arm plates to form an upper-arm circuit in conjunction with the pair of upper-arm plates, the lower-arm chips being arranged in a second direction perpendicular to the thickness direction and connected in parallel to each other between the pair of lower-arm plates to form a lower-arm circuit in conjunction with the pair of lower-arm plates;
a plurality of signal terminals correspondingly and electrically connected to the pads of the semiconductor chips;
a joint part electrically connecting one of the pair of upper-arm plates which is disposed on a lower-potential side of each of the upper-arm chips and one of the pair of lower-arm plates which is disposed on a higher-potential side of each of the lower-arm chips; and a sealing resin body integrally sealing at least a portion of each of the pair of upper-arm plates, at least a portion of each of the pair of lower-arm plates, the semiconductor chips, the joint part, and a portion of each of the signal terminals, wherein the pads of the upper-arm chips are formed on the same side of the main electrodes on the back surfaces in a direction perpendicular to both of the first direction and the thickness direction, and the signal terminals corresponding to the upper-arm chips extend in the same direction, the pads of the lower-arm chips are formed on the same side of the main electrodes on the back surfaces in a direction perpendicular to both of the second direction and the thickness direction, and the signal terminals corresponding to the lower-arm chips extend in the same direction, the joint part is continued to one end portion of the upper-arm plate in the first direction which is closer to the lower-arm plate and also continued to one end portion of the lower-arm plate in the second direction which is closer to the upper-arm plate, and each of inductances of parallel-connecting parts of the pair of upper-arm plates which connect the plurality of upper-arm chips in parallel and inductances of parallel-connecting parts of the pair of lower-arm plates which connect the plurality of lower-arm chips in parallel is smaller than an inductance of a series-connecting part which includes the joint part and connects the upper-arm circuit and the lower-arm circuit in series.

2. The semiconductor device according to claim 1, wherein
the first direction and the second direction are the same direction, and
all the signal terminals extend in the same direction.

3. The semiconductor device according to claim 2, wherein
the plurality of upper-arm chips connected in parallel and the plurality of lower-arm chips connected in parallel are aligned in a row.

4. The semiconductor device according to claim 1, wherein
each of a length of the parallel-connecting parts of the upper-arm plates in the first direction and a length of the parallel-connecting parts of the lower-arm plates in the second direction is smaller than a path length of the series-connecting part serving as a current path.

5. The semiconductor device according to claim 4, wherein
each of the length of the parallel-connecting parts of the upper-arm plates in the first direction and the length of the parallel-connecting parts of the lower-arm plates in the second direction are smaller than an extension length of the joint part.

6. The semiconductor device according to claim 1, wherein
each of a width of the parallel-connecting parts of the upper-arm plates which are perpendicular to the first direction and a width of the parallel-connecting parts of the lower-arm plates which are perpendicular to the second direction is larger than a width of the joint part connecting the lower-potential upper arm plate and the higher-potential lower arm plate which is perpendicular to an extending direction of the joint part.

7. The semiconductor device according to claim 1, wherein
each of a thickness of the parallel-connecting parts of the upper-arm plates and a thickness of the parallel-connecting parts of the lower-arm plates is larger than a thickness of the joint part which is perpendicular to a flowing direction of a current.

8. The semiconductor device according to claim 1, wherein
a surface of the joint part has an uneven shape having at least one of a depressed portion and a protruding portion.

9. The semiconductor device according to claim 1, wherein
the joint part has a through hole.

* * * * *